United States Patent [19]

Shea et al.

[11] Patent Number: 5,477,942

[45] Date of Patent: Dec. 26, 1995

[54] PUSH BUTTON ASSEMBLY

[75] Inventors: Timothy S. Shea, Morristown; Surjit S. Sandhu, Neshanic Station, both of N.J.

[73] Assignee: Inventio AG, Hergiswil NW, Switzerland

[21] Appl. No.: 321,600

[22] Filed: Oct. 12, 1994

Related U.S. Application Data

[63] Continuation of Ser. No. 105,059, Aug. 12, 1993, abandoned.

[51] Int. Cl.$^6$ .................................. B66B 1/14; H01H 9/00
[52] U.S. Cl. ........................... 187/395; 200/309; 200/317
[58] Field of Search ................................ 187/395, 396; 338/47; 307/112; 200/212, 317, 309

[56] References Cited

U.S. PATENT DOCUMENTS

| | | | |
|---|---|---|---|
| 4,179,594 | 12/1979 | Coyle et al. | 200/310 |
| 4,267,725 | 5/1981 | Roth et al. | 73/862.6 |
| 4,489,302 | 12/1984 | Eventoff | 338/99 |
| 4,504,713 | 3/1985 | Hennessey | 200/241 |
| 4,570,754 | 2/1986 | Orndorff et al. | 187/1 R |
| 4,805,739 | 2/1989 | Lind et al. | 187/121 |
| 5,039,832 | 8/1991 | Polacek et al. | 200/317 |
| 5,040,640 | 8/1991 | Slabinski et al. | 187/121 |
| 5,149,986 | 9/1992 | Jalbert | 307/117 |
| 5,162,665 | 11/1992 | Troyen | 307/112 |
| 5,278,557 | 1/1994 | Stokes et al. | 341/34 |
| 5,288,957 | 2/1994 | Swaybill | 200/317 |
| 5,367,133 | 11/1994 | Schmidt et al. | 200/5 A |

FOREIGN PATENT DOCUMENTS

| | | | |
|---|---|---|---|
| 1762674 | 4/1970 | Germany. | |
| 3703666 | 10/1987 | Germany. | |
| WO87/04878 | 8/1987 | WIPO | H03K 17/975 |

*Primary Examiner*—Peter S. Wong
*Assistant Examiner*—Robert Nappi
*Attorney, Agent, or Firm*—Sandler, Greenblum & Bernstein

[57] ABSTRACT

An electronic push button assembly, used as a call and signal generator in elevator controls and installed, via rear surface attachment, in a service control station or indicator board at floor stops and in elevator cars, consists of a push button guide, a carrier plate, an optical acknowledgement device and an electronic portion, wherein the mechanical portion of the push button assembly includes a plunger element, guided and limited for movement by an illuminated ring plate which, through an elastic pressure cap, pressure activates a pressure sensitive resistance FSR when the push button assembly is activated, with the change in resistance of the FSR, resulting from the mechanical pressure, produces a potential change within a voltage divider whereby, via a trigger/preamplifier, a switching transistor is activated and in turn switches on a corresponding load, a potential separation being utilized by the load, via a contact, to complete the acceptance switching circuit, with the basic mechanical construction permitting differing variations relative to design and function.

12 Claims, 2 Drawing Sheets

PUSH BUTTON ASSEMBLY

This application is a continuation of application Ser. No. 08/105,059, filed Aug. 12, 1993, now abandoned.

BACKGROUND OF THE INVENTION

1. Field of the Invention

The invention pertains to an electronic push button or push button assembly for use as a call or signal generator, particularly in elevator controls, for installation, with rear surface attachment, in a service control station or indicator board on floors and in elevator cars including a push button guide, carrier plate, means for optical acceptance or acknowledgement, and an electronic portion.

2. Discussion of the Background of the Invention and Material Information

Push buttons of the aforementioned type are known in different variations, on one hand with reference to the utilized active elements and, on the other hand, with reference to the constructional shape or development. The phrase "active element" denotes such structural details, which produce an electrical signal as a result of a mechanical force input or which at least changes its electrical characteristics. Structural details of the first type are, for example, those which function according to the piezo-electric principle. Upon a force input the piezo-electric crystal gives off a voltage pulse. Structural details of the second type, upon force input, change their electrical properties in the sense that, for example, the capacity values, the inductance, or the ohmic resistance undergoes a change in value.

It is known that such elements are utilized in the construction of silent or click-free switches. In addition, a further advantage is utilized in that push buttons with extremely short or no actuation travel or stroke can be realized.

U.S. Pat. No. 4,805,739 describes a push button element for elevator control stations or indicator boards which function according to the piezo-electric principle. Without an ascertainable mechanical actuation path, upon pressing of a membrane-like disk, a piezo-electric element, attached to the rear surface of this disk, is actuated and the voltage pulse resulting therefrom is utilized as a control signal. A transparent housing, transfers the acknowledgement or "call-registered" signal via LED's to an illuminated ring on the surface of the control station or indicator board.

Operating personnel deem it a deficiency if the switch actuation does not involve an actuation path or movement.

Further U.S. Pat. No. 4,489,302 describes an element that changes electrically as a result of force or pressure. It pertains to a multi-layer semi-conductor element, which, independent of an actuation path, changes its electrical resistance. A constructive embodiment for a useful or practical push button element is not presented.

Published German Patent Application DE 37 03 666 discloses the use of a pressure dependent resistance for a call emitter or calling device having a LED-acceptance or acknowledgement. The illustrated solution for such a push button element in FIG. 3 is, however, only symbolic and is not a valid useable construction.

SUMMARY OF THE INVENTION

An object of the subject invention is to produce, on the basis of a contact-less or contact free element, a complete push button assembly as a calling device, having an optical acknowledgement, for use in an elevator control wherein a specific actuation path, a simple, cost-effective construction and the combination of differing design elements are desired.

This object is attained in an electronic push button assembly for use as a call and signal generator in elevator controls for installation with rear surface attachment in service control stations or indicator boards at floor stops and in elevator cars having a carrier plate; means for providing an optical acknowledgement; and an electronic portion; wherein the push button assembly further includes a plunger element; means for guiding the plunger element; the plunger element being capable of limited movement within the means for guiding; a pressure-sensitive element; an elastic pressure cap capable of acting on the pressure sensitive element, upon actuation of the plunger element, with a pressure not exceeding a maximum tolerable value; and a plurality of differing pressure plates; the plunger element being in combination with one of the plurality of differing pressure plates.

The electronic push button assembly further includes a compression spring, acting against the plunger element, wherein an upper surface of the elastic pressure cap, which during actuation of the push button element touches the pressure sensitive element, by means of the compression spring, during inaction of the push button assembly assumes non-touching, spaced position relative to the pressure sensitive element.

In one embodiment of this invention the push button assembly includes insertable indicia means between one of the plurality of pressure plates and the plunger element.

In other embodiment of the invention the pressure sensitive element is a force-sensitive resistor, a strain gage, or a micro-switch.

A further embodiment includes a reflector plate, with means for guiding an illuminated ring plate.

Anti-twist safety devices can take the form of at least one slot in the plunger element and at least one rib in the illuminated ring plate, the at least one rib being in engagement with the at least one slot, or taking the form of a pin in the illuminated ring plate and pilot hole in the reflector plate, with the pin being received within the pilot hole.

In addition, the illuminated ring plate serves as the means for guiding the plunger element, with the illuminated ring plate and the reflector plate including means for permitting limited movement of the plunger element.

The advantages of the subject invention are realized in that a person, during actuation of a push button, obtains or has a satisfying reaction to the actuation movement of the push button assembly. The construction, according to the invention, can in one variation or embodiment be deemed as vandal-resistant since the push button assembly has no protruding parts and is totally flush with the control station or indicator board surface. Furthermore, pressure plates compatible with the control station or indicator board can be utilized. The construction, according to the invention, furthermore permits the problem-free exchange if need be, of defective electronics without disassembly of the push button assembly.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF THE PREFERRED EMBODIMENTS

Figure 1:
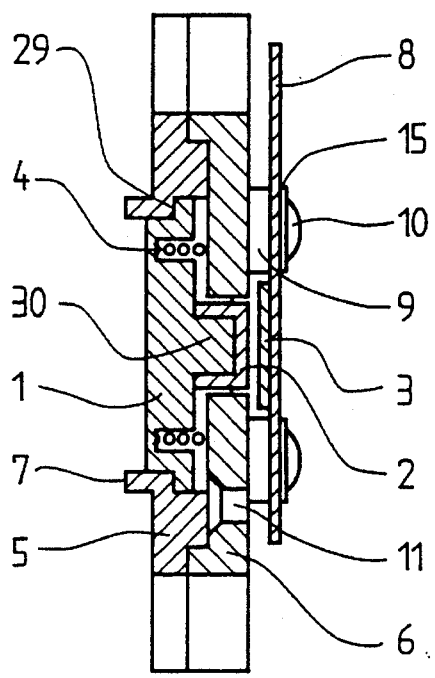
FIG. 1 is a cross section of a push button element.

In the cross section in FIG. 1, numeral 1 denotes a plunger or plunger element, the rear side of which includes a groove that houses a compression spring 4. Plunger 1 is limited in its horizontal movement via guidance by an illuminated ring plate 5 which is transparent and preferably constructed of Lexan or acrylic resin. The annular protrusion or extension on the left edge or side of illuminated ring plate 5 takes the form of an illuminated ring 7 which, in the installed state of the push button assembly, on the front surface of the control station or indicator board, remains as the only visible portion of illuminated ring plate 5.

A recess in illuminated ring plate 5 and a projecting edge 29 on the right side of plunger 1 serve as movement arrestors or stops for the left hand movement of plunger 1. A reflector plate 6, combined with illuminated ring plate 5, serves as a movement arrestor or stop for the right hand movement of plunger 1, with plunger 1 having a plug-shaped control extension 30 on its right side which is covered with an elastic pressure cap 2. Plunger 1 is permanently biased to the left, via compression spring 4, supported on its right side on reflector plate 6, against the arrestor or stop portion in illuminated ring plate 5.

Reflector plate 6 is provided with a plurality of circular recessed bores 11 which serve for the retention of non-illustrated LED's (light emitting diodes). Reflector plate 6 is preferably constructed of white-dyed Lexan or other comparable plastic.

An electronic printed circuit board 8 is attached to the rear surface of reflector plate 6 with bolts 10 and washers 15, but spaced therefrom via spacer disks 9. Circuit board 8 includes a force sensitive resistor (FSR) 3 that is located directly behind elastic pressure cap 2 of plunger 1 and is compressively or mechanically pressure-loaded upon the actuation of the plunger of the push button assembly.

The push button assembly according to this invention, as already noted relative to its advantages, can be provided with different pressure plates.

Figure 2:
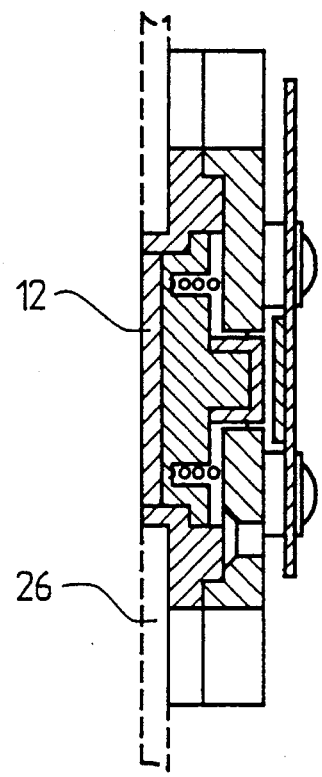
FIG. 2 is a cross section of a push button element with a flush, flat pressure plate.

As illustrated in FIG. 2, a flat pressure plate 12, flush with the control station or indicator board, is utilized. This embodiment can be considered as substantially resistant to vandalism since it has no protrusions for the application of tools.

Figure 3:
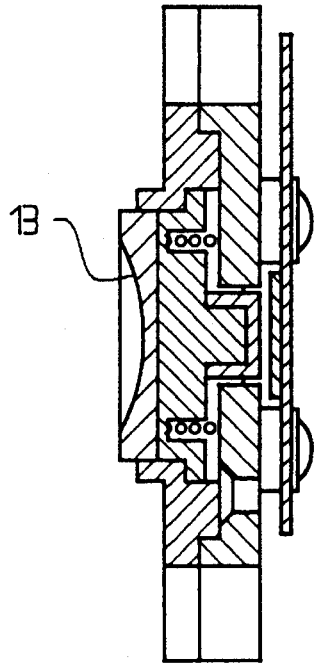
FIG. 3 is a cross section of a push button element with a protruding, centrally recessed pressure plate.
Figure 4A:
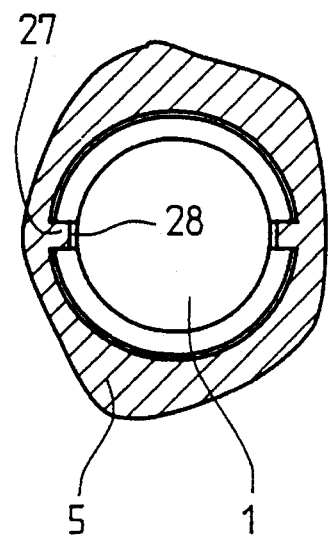
FIG. 4a is a cross section, with parts broken away, of a push button element showing an internal twist safety device.
Figure 4B:
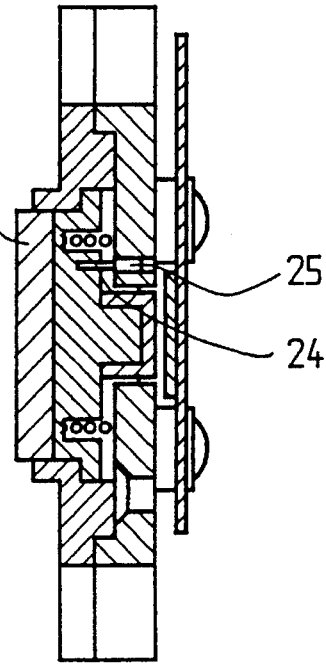
FIG. 4b is a cross section of a push button element with a protruding, flat pressure plate.

FIG. 3 shows a protruding pressure plate 13 having a central recess, while FIG. 4b also shows a protruding but flat pressure plate 14.

Figure 5:
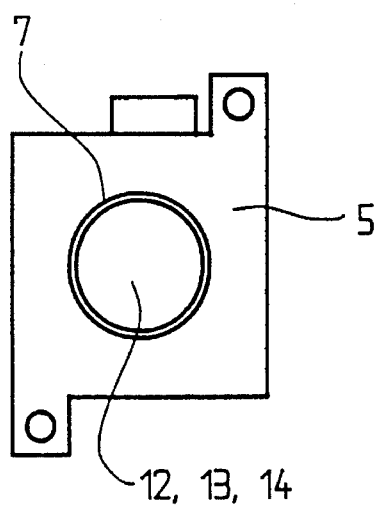
FIG. 5 is a frontal view of the push button element.

The frontal view of FIG. 5 shows the contour or shape of illuminated ring plate 5 as well as that of illuminated ring 7. Numerals 12, 13 and 14, of course, pertain to the already previously described pressure plates.

Figure 6:
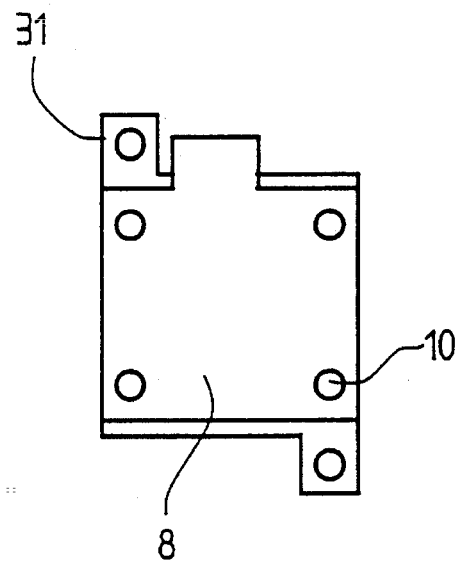
FIG. 6 is a rear view of the push button element.

FIG. 6 shows the contour or shape of electronic printed circuit or circuit board 8. The upper tab or rectangle 31 thereof serves for an internal plug connection.

Figure 7:
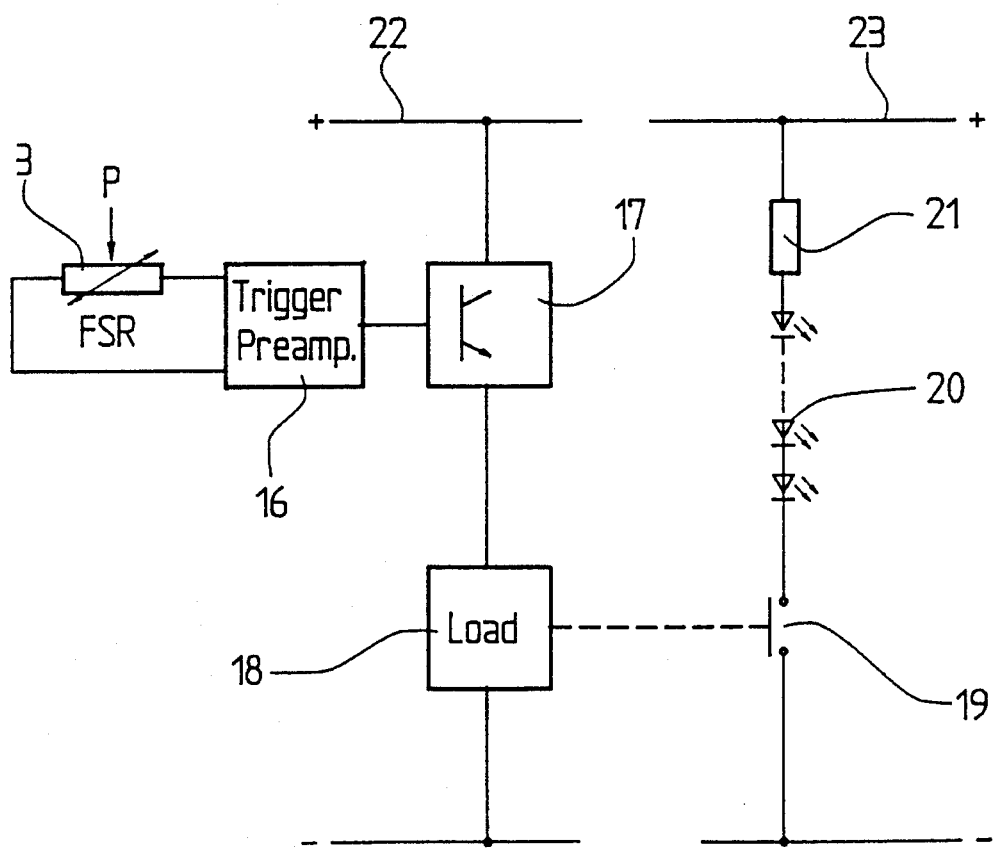
FIG. 7 is a switching circuit of the push button electronics.

FIG. 7 shows a simplified switching schematic. A switching transistor 17 and an electrical load 18 are shown connected in series with the electrical potential of a supply voltage 22. Electrical load 18 can be a relay or a protective coil-shield. Switching transistor 17 is controlled by a trigger/preamplifier 16 when the initially connected resistance FSR 3 is suitably changed via a pressure or compressive input or load.

A position-control or "call registered" circuit is shown in a second galvanic/voltaic separated voltage circuit 23. A contact 19 of electrical load 18 completes the circuit wherein electricity flows through a plurality of series-actuated LED's 20 and through an also series-actuated additional resistance 21 thereby producing an optimum position-control or "call-registered" signal.

The function or operation of this construction, according to the invention, has already been substantially explained via the previous description of the components thereof. However, with regard thereto, several details will still be described.

The push button assembly, according to this invention, as shown and discussed relative to FIG. 2, can be attached to the rear surface of a control station or indicator board plate 26 in a known manner and illuminated ring 7 achieves a flat, flush setting with plate 26.

The utilized FSR 3 changes its ohmic resistance, with a force input, for example, in the range of 1000: 1 so that 1 Megohm - FSR resistance 3, via the actuation of the push button still registers 100 ohms. This large resistance change is therein utilized in that the FSR 3, in conjunction with a further but constant non-illustrated resistance, forms a potential or voltage divider, whose center tap, between the two resistances, via a non-illustrated base resistor, controls trigger/preamplifier 16 in a known manner, so that the latter, as already mentioned, brings switching transistor 17 into a conductive state whereby electrical load 16 is switched on and load contact 19 closes the "call-registered" circuit.

During the non-actuation, or the at rest position of the push button, not only is FSR 3 totally unloaded, but also slightly spaced from plunger 1 by a narrow air gap between FSR 3 and the upper surface of elastic pressure cap 2. This arrangement has the advantage that the construction, on one hand, is less dependent on dimensional tolerances and, on the other hand, results in no undesired or dangerous commands being given via temperature induced warping of parts.

A further effect of this construction, according to the invention, is in that, due to the mechanical internal stops or arrestors of plunger element 1 and reflector plate 6, only limited movement of plunger element 1 is possible. In addition, since the plug-shaped central extension 30 of plunger 1 is covered with an elastic pressure cap 2 and since spacer disks 9 are accordingly dimensioned, the maximum allowable compressive force on FSR 3 cannot be exceeded, even with a maximum force input on the plunger of the push button assembly.

The principle of interchangeable pressure plates 12, 13 and 14 permits an extensive accommodation to the control station or indicator board design, to customer wishes and special functions. The number of interchangeable board pressure plates is of course not limited to the three illustrated examples, 12, 13 and 14. If the push button assemblies are provided with indicia and if transparent pressure plates are utilized, the indicia can be added as a printed intermediate layer between pressure plates 12, 13 and 14 and plunger 1. In this case, in the push button assembly, as illustrated in FIG. 4b, a rotational stop is provided via a pin 24 and pilot hole 25.

It is further feasible for safety switches having the required galvanic separation, in view of the realized actuation manner, to actuate a micro switch having the same basic construction. The micro switch is arranged on a non-illustrated carrier plate with the same shape as the printed circuit board and the carrier plate is mechanically connected with the push button assembly via retaining elements 9, 10 and 15.

In the embodiment shown in FIG. 4a, plunger element 1 is additionally insured in a further manner against rotation or twisting in that plunger element 1 has at least one groove or slot 28 on its outer periphery into which a rib or key 27, preferably integral with illuminated ring plate 5, is engageable.

With the basic mechanical construction, according to this invention, it is possible to utilize any desired elements that react to pressure. Thus, for example, a resistance bridge, including a strain gage, can be arranged on printed circuit board 8, whose elastic deformation, resulting from pressure on the board, can exert a control function.

While there are shown and described present preferred embodiments of the invention, it is to be distinctly understood that the invention is not limited thereto, but may be otherwise variously embodied and practiced within the scope of the following claims and the reasonably equivalent structures thereto.

What is claimed is:

1. An electronic push button assembly for use as a call and signal generator in elevator controls for installation with rear surface attachment in service control stations or indicator boards at floor landings and in elevator cars that includes a carrier plate, means for providing an optical acknowledgement of actuation of an elevator call and an electronic portion, said push button assembly comprising:

a plunger element, said plunger element having opposed inner and outer sides, said inner side having both a projecting edge and a central control extension;

a reflector plate;

means, including said plunger projecting edge, for guiding said plunger element for a limited axial movement, for a first distance, relative to said reflector plate;

a pressure sensitive element affixed to and axially spaced from said reflector plate for a second distance, said second distance being less than said first distance;

a generally circular elastic pressure cap, affixed to said control extension, for acting on said pressure sensitive element, upon actuation of said plunger element with a pressure not exceeding a maximum tolerable value, said maximum tolerable value being limited by an elastic deflection between said pressure cap and said pressure sensitive element over a third distance, said third distance being the difference between said first and second distances; and said plunger element being adapted to accept one of a plurality of differing pressure plates.

2. The electronic push button assembly of claim 1 further comprising a single concentric compression spring arranged on said reflector plate for acting against said plunger element, wherein an outer surface of said elastic pressure cap, which during actuation of said push button assembly touches said pressure sensitive element, by means of said compression spring, during inaction of said push button assembly assumes non-touching, spaced position, corresponding to said second distance, relative to said pressure sensitive element.

3. The electronic push button assembly of claim 2 further comprising indicia means, said indicia means being insertable between one of said plurality of differing pressure plates and said plunger element.

4. The electronic push button assembly of claim 1 wherein said pressure sensitive element is a force-sensitive resistor.

5. The electronic push button assembly of claim 1 wherein said means for guiding said plunger element for a limited axial movement, for a first distance, includes an illuminated ring plate.

6. The electronic push button assembly of claim 5 further including an anti-twist safety device in the form of at least one slot in said plunger element and at least one rib, in said illuminated ring plate, said at least one rib being in engagement with said at least one slot.

7. The electronic push button assembly of claim 5 including an anti-twist device in the form of a pin in said illuminated ring plate and pilot hole in said reflector plate, with said pin being slidably received within said pilot hole.

8. An electronic push button assembly for use as a call and signal generator in elevator controls for installation with rear surface attachment in service control stations or indicator boards at floor stops and in elevator cars, said push button assembly comprising;

a plunger element, said plunger element having opposed inner and outer surfaces, said inner surface having both a projecting edge and a central control extension;

a reflector plate;

means for guiding movement of said plunger element for limited axial movement for a first distance, relative to said reflector plate;

a pressure-sensitive electrically conductive element affixed to and axially spaced from said reflector plate for a second distance shorter than said first distance and activated upon a predetermined movement of said plunger element;

a generally circular elastic pressure cap mounted on said central control extension for activating said pressure-sensitive element in response to actuation of said plunger element with a pressure not exceeding a tolerable maximum value, said tolerable maximum value being limited by an elastic deflection between said pressure cap and said pressure sensitive element over a third distance, said third distance being the difference between said first and second distances; and said plunger element being adapted to accept one of a plurality of differing pressure plates.

9. The electronic push button assembly of claim 8 further including a single compression spring for separating said plunger element from said pressure-sensitive element, wherein an outer surface of said elastic pressure cap, which during actuation comes into contact with said pressure sensitive element, via said single compression spring during inaction of said plunger element, assumes a non-touching spaced position relative to said pressure sensitive element.

10. The electronic push button assembly of claim 5 wherein said pressure plate is flat and flush with an outer annular surface of said ring plate.

11. The electronic push button assembly of claim 5 wherein said pressure plate is centrally recessed and axially protruding with reference to an outer annular surface of said ring plate.

12. The electronic push button assembly of claim 5 wherein said pressure plate is flat and axially protruding with reference to an outer annular surface of said ring plate.

* * * * *